United States Patent [19]

Hedberg

[11] Patent Number: 5,367,201

[45] Date of Patent: Nov. 22, 1994

[54] CONTROL CIRCUIT SYSTEM FOR CONTROL OF PARAMETERS IN LOGIC CIRCUITS OR SIMILAR

[75] Inventor: Mats O. J. Hedberg, Haninge, Sweden

[73] Assignee: Telefonaktiebolaget L M Ericsson, Stockholm, Sweden

[21] Appl. No.: 84,122

[22] Filed: Jul. 1, 1993

[30] Foreign Application Priority Data

Jul. 1, 1992 [SE] Sweden .............................. 9202033-8

[51] Int. Cl.$^5$ ............................................. H03K 17/16
[52] U.S. Cl. .................................. 327/543; 327/530; 327/322
[58] Field of Search ............ 307/491, 494, 264, 296.8, 307/296.1

[56] References Cited

U.S. PATENT DOCUMENTS

| | | | |
|---|---|---|---|
| 4,410,813 | 10/1983 | Barker et al. | 307/362 |
| 4,435,652 | 3/1984 | Stevens | 307/297 |
| 4,791,318 | 12/1988 | Lewis et al. | 307/297 |

*Primary Examiner*—Margaret R. Wambach
*Attorney, Agent, or Firm*—Burns, Doane, Swecker & Mathis

[57] ABSTRACT

A control circuit system for controlling one or more parameters in a circuit with at least one operational stage is disclosed, in the form of a delay stage or a logic stage, the operational stage comprising at least one operational circuit, at least one operational current source for supplying a drive current for the operational stage, and at least one operational load. The operational stage also comprises a number of controllable components of the operational current source and of the operational load, allowing control of the size of the drive current and of the load, respectively, in the operational stage. At least one reference stage includes essentially an image circuit of the operational stage with a reference current source for supplying a drive current for the reference stage and a reference load, comprising a number of controllable reference components, allowing control of the size of the drive current and the load, respectively, of the reference stage. The reference stage, using a reference quantity, controls the currents of the reference and operational current sources to the reference load and the operational load components, respectively.

12 Claims, 2 Drawing Sheets

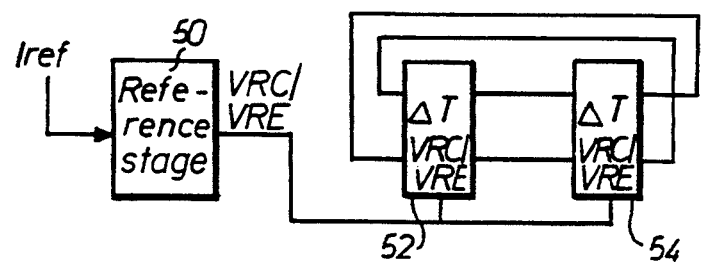
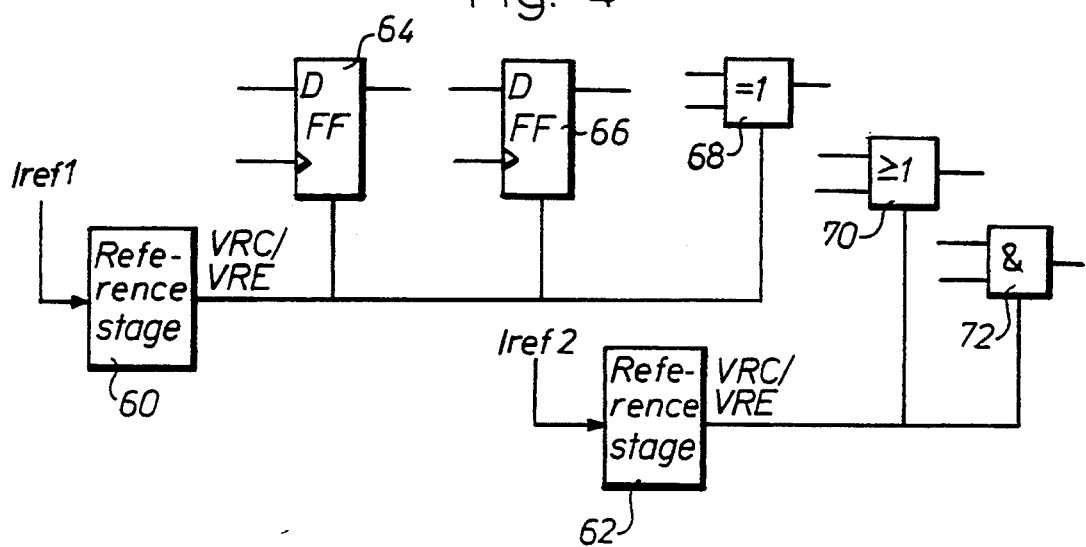

CONTROL CIRCUIT SYSTEM FOR CONTROL OF PARAMETERS IN LOGIC CIRCUITS OR SIMILAR

TECHNICAL AREA

The present invention relates to a control circuit system for controlling one or more parameters in a circuit with
at least one operational stage, particularly a differential stage, in the form of delay stage or a logic stage. The operational stage comprising at least one operational circuit, at least one operational current source for supplying a first drive current to said operational stage, and at least one operational load.

The control includes optimization and the parameter includes power and/or bandwidth and/or delay.

BACKGROUND

Power optimization and/or bandwidth optimization of logic circuits up to now has been obtained by designing different logic parts with different bandwidth, to enable optimization of bandwidth and by this reduction of power consumption.

With regard to delay stages, the state of the art includes different possibilities.

The most usual way is to adjust a threshold level or a decision point along a flank and thereby shift a switch-over of a following stage forwards or backwards in time.

Another method is to add or subtract a capacitive load in a circuit stage for coarse adjustment and to change the current for fine adjustment.

A third method is to use diodes as collector loads. By varying the current through the diodes, the resistances of diodes will vary, which in turn changes the time constants of the circuit.

SUMMARY OF THE DISCLOSURE

The object of the present invention is to provide a control circuit system, which enables control of the bandwidth of various delay and logic circuits in a controlled way.

This object is achieved by a control circuit system of the kind defined by way of introduction comprising a number of first controllable current source and load components of said operational current source and said operational load for admitting control of the magnitude of said first drive current and of said operational load, respectively. The system also comprises at least one reference stage comprising essentially an image circuit of said operational stage with a reference current source for supplying a second drive current for reference stage, and a reference load, reference current source and the reference load comprising a number of second controllable current source and load components for admitting control of the magnitude of the second drive current and of the reference load, respectively, and being essentially identical to the first current source and load components, respectively. The reference stage also includes an input stage connected for receiving an adjustable reference parameter and for controlling, by means of the reference parameter, current supply from the reference current source and the operational current source to the second and first controllable load components, respectively.

The system also comprises a comparison and control circuit connected for comparing the magnitude of the reference load with a load reference and for controlling an operational parameter of the reference load components and operational load components so as to keep the relationship between said reference load and the load reference the same irrespective of the magnitude of the current through the reference load, and thereby keep the operational point of the operational stage constant for various drive currents in the latter.

The system according to the invention fulfils a requirement of being able to control the bandwidth, i.e., the speed, of various logic circuits and delay stages in a controlled manner. Of a number of different applications of a control circuit system according to the invention the following can be mentioned:

Delay line for data or clock signals.
Oscillators where a delay stage determines the feedback time and by this the frequency
Filter with controllable parameters
Power optimization of logic circuits. Because the drive current is directly proportional to the bandwidth, it is possible to design circuits which can be adapted to various speeds. By this it is possible to save power at lower speeds, based upon the understanding that unnecessary fast logic is not necessary.

According to a preferred embodiment of the invention, the reference parameter is a reference current and the input stage includes a transistor component connected for the throughflow of the reference current, and the reference and operational current sources each include an essentially identical transistor component, the control electrodes of which being connected to a voltage outlet of the transistor component of the input stage.

The transistor components of the input stage and said reference current source may be preferably interconnected in a current image circuit.

The load components of the reference stage and the operational stage are preferably transistor components, having control electrodes to which a voltage output from the comparison and control circuit is connected.

The comparison and control circuit may then include an operational amplifier having a first input connected for sensing the voltage over the load transistor component of the reference stage and a second input connected for sensing a fixed reference voltage constituting the load reference.

Preferably, the transistor components of the reference and operational current sources may be NMOS-transistors and the transistor components of the reference and operational loads may be PMOS-transistors.

The control circuit system according to the present invention can further comprise a number of reference stages, loads and current sources of the operational stage can be of different size than corresponding elements of the reference stage, and the operational stage can include various combinations and numbers of operational stage, operational current source and operational load.

DESCRIPTION OF THE FIGURES

The invention will now be described in detail with reference to the shown embodiments on the enclosed drawings, where FIG. 3 shows a circuit diagram of a current controlled oscillator, which schematically illustrates an application of the present invention for frequency control of a feedback delay stage chain, and FIG. 4 shows a circuit diagram, which schematically illustrates an application of the present invention in a mixed logic.

DETAILED DESCRIPTION OF THE DISCLOSURE

Figure 1:
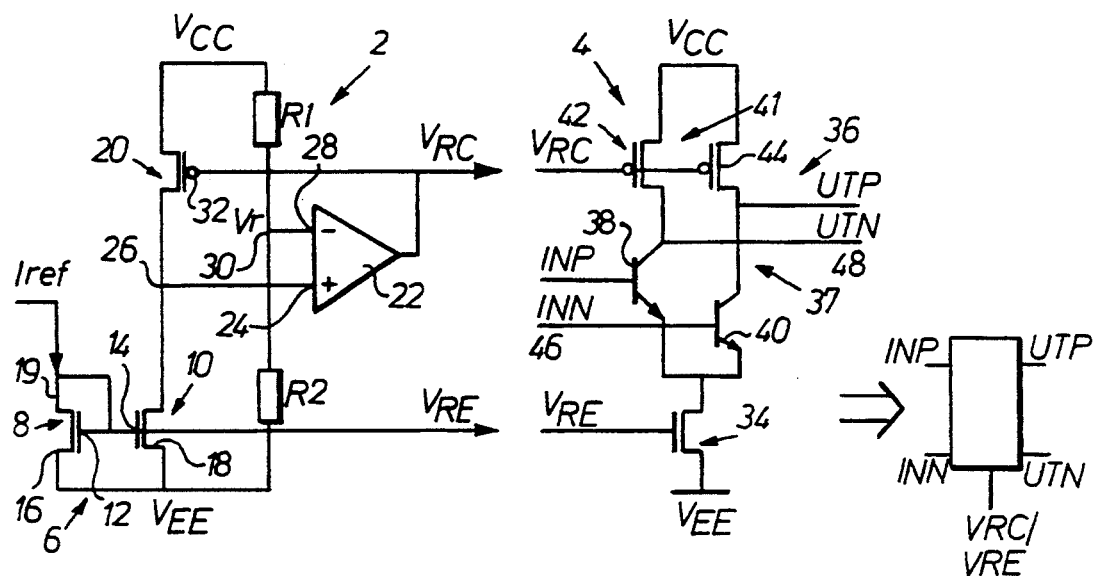
FIG. 1 shows a circuit diagram of one embodiment of the control circuit system according to the present invention.

FIG. 1 illustrates a reference stage is 2, and a logic stage or a simple delay stage 4. To the right of the stage 4 the same is also shown symbolized as a delay stage. The task of the reference stage 2 is, as described in detail below, to keep the operational point of the logic stage/delay stage 4 constant for various drive currents.

The reference stage 2, as an input, has a current image circuit, generally designated 6, which can be of a conventional design per se. More specifically, the current image circuit 6 includes two NMOS-transistors 8 and 10, which are arranged with their respective control electrodes 12 and 14 interconnected, and with their respective emitter electrodes 16 and 18 connected to a minimum voltage $V_{EE}$ of the reference stage 2 and the logic stage 4. The collector electrode 19 of the transistor 8 is connected for receiving a reference current $I_{ref}$ and interconnected with the control electrodes 12 and 14. Due to the current $I_{ref}$ flowing through the transistor 8 a voltage $V_{RE}$ caused by the resistance of the transistor 10 appears on the control electrode 12 of the transistor 8, as well as on the control electrode 14 of the transistor 10. For the transistor 10 the conception "reference current source" is here introduced for reasons, which will become apparent from the description below.

The transistor 10, in series with a PMOS-transistor 20 is connected in parallel with two resistances R1 and R2 between the voltage $V_{EE}$ and a maximum voltage $V_{CC}$. The PMOS-transistor 20 constitutes a collector load of the NMOS-transistor 10. An operational amplifier 22 has a plus-input 24 connected to a voltage outlet 26 between the transistors 10 and 20, and a minus-input 28 connected to a voltage outlet 30. The output of the operational amplifier 22 is connected to the control electrode 32 of the PMOS-transistor 20 and has a voltage designated $V_{RC}$. For the transistor 20, the conception "reference load" is here introduced for reasons which will become apparent from the further description below.

Between the voltage points $V_{EE}$ and $V_{CC}$, the logic stage 4 has an NMOS transistor 34 which is identical to the transistors 8 and 10 and a collector load, 36, of the transistor 34. The collector load 36 on the one hand includes an operational stage 37, comprising a differentially connected stage of two transistors 38 and 40, and on the other hand an operational load 41. The operational load 41 comprises two PMOS-transistors 42 and 44, which constitute a collector load of the transistors 38 and 40, respectively. The transistors 42 and 44 are identical to the PMOS-transistor 20. On the respective control electrodes, the transistor 34 is controlled by the voltage $V_{RE}$ and the transistors 42 and 44 by the voltage $V_{RC}$. The inputs INP and INN, at 46, of the operational stage 37 are connected to the base electrodes of transistors 38 and 40, respectively, and their outputs UTP and UTN, 48, are connected to the respective collector electrodes of the same transistors.

The operation of the described circuits is as follows.

The task of the reference stage 2 is to keep the operating point of the logic stage 4 constant for different drive currents. The reference stage 2 is an image circuit of the logic stage, and its PMOS- and NMOS-transistors have the same dimensional values as those in the logic, or are specifically related thereto. The reference current $I_{ref}$ is reflected partly to the PMOS-transistor 20 in the reference stage and partly to all controlled logic circuitry via the voltage reference $V_{RE}$. As a result all controlled current sources work with the same reference.

To keep the output signal from the logic circuitry at 48 constant and independent of the collector resistance, it is necessary to adjust the collector load 42 and 44 in response to the current received from the current source 34, which is done by the reference stage 2. The reference stage has an internal voltage reference in the form of the voltage divider R1/R2 with the reference voltage $V_r$. This voltage is compared by the operational amplifier 22 with the voltage over the collector load 20. By means of the operational amplifier 22, the resistance of the collector load 20 is adjusted so as to keep the voltage drop over the latter similar to that over the resistance R1 irrespective of the magnitude of the current drawn through the transistor 20. The control voltage $V_{RC}$ on the load 20 is distributed to all controlled logic, whereby all collector loads of the reference stage and the logic stage become equal. Since the swing over the collector load is small, the load can be considered as purely resistive.

The voltage/time derivative of the output signal from a differential stage, as the stage 38,40, is determined by the time constant of the load 42/44 in the stage since the bipolar transistors can be considered as ideal current sources. The loads can be considered as pure RC-loads with the resistance of the PMOS-transistors 42 and 44 and the capacitance consisting of the parasitic capacitances of the latter and of the transistors 38,40, and connection network plus loads following thereafter. The capacitive loads are constant whereas the resistance can be controlled via the control voltage $V_{RC}$ of the PMOS-transistors 42,44. The swing of the output signal at 48 is determined by the current from the current source, i.e. the NMOS-transistor 34 and the load resistance 42 and 44. The current can be controlled via the control voltage $V_{RE}$ on the NMOS-transistor 34.

The circuit shown in FIG. 1 is a basic building block, which can be varied in many ways in order to provide the desired function. What always is common is however the collector resistances and the current sources and their location toward positive and negative supply voltage, respectively.

Figure 2:
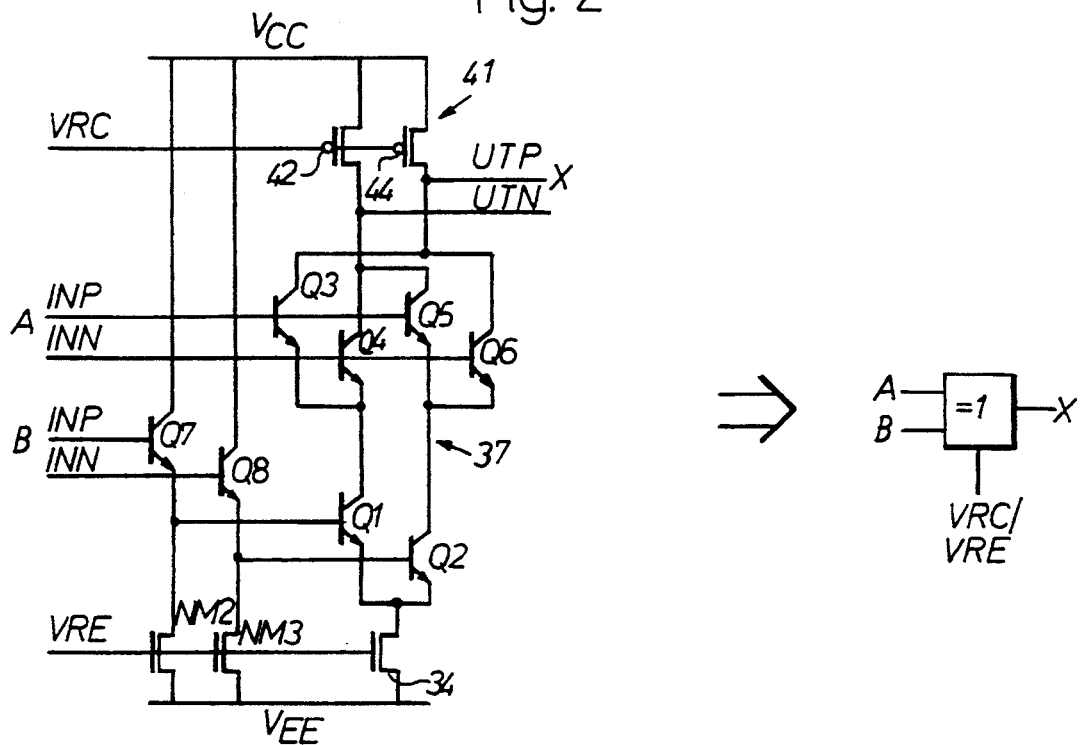
FIG. 2 shows a circuit diagram of a further embodiment of the control circuit system according to the present invention.

FIG. 2 illustrates how logic circuitry can be built with the aid of the parts, which are shown in the basic logic stage 4 in FIG. 1. Parts corresponding to those in FIG. 1 have been provided with the same reference designations. More particularly, what is shown as an example is the design of an exclusive-OR-gate which is bandwidth controlled in accordance with the present invention. To the right of the detailed circuit the established symbol thereof is shown. As the gate circuit is of a conventional type known per se, it is not necessary to describe its design in detail here.

Shortly, however, the circuit is of a differential type, i.e., each logic input, A and B, respectively, of the operational stage 37, is associated at each input with two differentially operating signal conductors INP and INN. A logic high level, or 1, on input A implies that INP on A is more positive than INN on A. A logic low level, or 0, on A implies that INN is more positive than INP. The same reasoning is of course also valid for the differential output of the operational stage, designated X.

The function of the gate can be described as follows:

if the status of the inputs is regarded as a vector (A,B), the vectors (0,0) and (1,1) shall result in a logic 0 on the output, and the vectors (0,1) and (1,0) shall result in a logic 1 on the output.

Considering the transistor circuit diagram, the vector (0,1) makes the current from current source 34 to be conducted through Q1 and Q4, this resulting in UTN being low and UTP being high. The vector (0,0) makes the current to be conducted through Q2 and Q6, which makes UTP to be low and UTN to be high, and so on. The transistors Q7 and Q8 and the current drains NM2 and NM3 have the purpose to achieve a voltage shift in order for the logic levels to work practically. By means of the circuit solution shown, the drive currents through the transistors Q7 and Q8 will have the same magnitude as the one through the logic circuitry.

In the control circuit system according to the present invention, e.g. according to FIG. 1 or 2, or the further embodiment described below, the reference stage and the controlled logic circuitry/delay circuit are preferably arranged on the same substrate, here silicon, in order to make different parameters, temperature etc. equal for the reference stage and logic circuitry, respectively. It is also possible to use several reference stages more locally and distribute currents to these and by this avoid problems, if any, resulting from temperature gradients.

Loads and current sources in the controlled logic circuitry or the delay circuit can exhibit various sizes, i.e. be scaled up and down or in different directions in relation to the ones of the reference stage, but the control of the parameters of these is always maintained.

In FIG. 3, there is illustrated the use of a reference stage of the type described above in association with a delay circuit in the form of a current controlled oscillator. In the Figure the reference stage 50 creates the two reference quantities $V_{RC}$ and $V_{RE}$ with the aid of a reference current $I_{ref}$. The oscillator can be designed in a way known per se with two delay stages 52 and 54, which both will receive the reference quantities.

The delay stages 52, 54, in their simplest form, can be designed as the stage 4 in FIG. 1. In general, however, they can include several such basic logic stages depending on the application. The input of the stages 52, 54 indicates that the stages are bandwidth controlled by a reference coming from a reference stage.

In FIG. 4, there is illustrated the use of two reference stages of the type described above for bandwidth control of mixed logic circuitry. The reference circuits 60 and 62, respectively, generate each of the reference quantities $V_{RC}$ and $V_{RE}$ with the aid of a respective reference current $I_{ref1}$ and $I_{ref2}$, respectively. These reference quantities are supplied to five logic stages in the way shown, said stages being only shown symbolically as two D-flipflops 64 and 66, one exclusive-OR gate 68, one OR-gate 70 and one AND-gate 72, respectively. The gate 68 can be designed as described above with reference to FIG. 2.

The stages 52, 54, 64–72 have in common that they can each be defined as comprising, in accordance with the present invention, and in the same way as in FIGS. 1 and 2, although not shown in FIGS. 3 and 4:

at least one operational circuit, at least one operational current source for supplying a first drive current to the operational stage, and at least one operational load, and a number of first controllable current source and load components of the operational current source and the operational load for admitting control of the magnitude of the first drive current and of the operational load, respectively.

Furthermore, the reference stages 50, 60 and 62 have in common that they can each be defined, also in accordance with the present invention, and in the same way as shown in FIGS. 1 and 2, although not shown in FIGS. 3 and 4, as comprising an image circuit of the operational stage with a reference current source for supplying a second drive current for the reference stage, and a reference load, the reference current source and the reference load comprising a number of second controllable current source and load components for admitting control of the magnitude of the second drive current and of said reference load, respectively, and being essentially identical to the first current source and load components, respectively, the reference stage also including an input stage connected for receiving an adjustable reference parameter and for controlling, by means of the reference parameter, current supply from the reference current source and the operational current source to the second and first controllable load components.

The image circuit also comprises a comparison and control circuit composed of elements 22–28 connected for comparing the magnitude of the reference load with a load reference and for controlling an operational parameter of the reference load components and operational load components so as to keep the relationship between the reference load and the load reference the same irrespective of the magnitude of the current through the reference load, and thereby keep the operational point of the operational stage constant for various drive currents in the latter.

It will be appreciated by those of ordinary skill in the art that the present invention can be embodied in other specific forms without departing from the spirit or essential character thereof. The presently disclosed embodiments are therefor considered in all respects to be illustrative and not restrictive. The scope of the present invention is indicated by the appended claims rather than the foregoing description, and all changes which come within the meaning range of equivalents thereof are intended to be embraced therein.

I claim:

1. A control circuit system for controlling one or more parameters in a circuit with
    at least one first stage in the form of delay stage or a logic stage said stage including
    at least one operational stage, at least one operational current source for supplying a first drive current to said operations stage, and at least one operational load,
    a plurality of first controllable current source and load components of said operational current source and said operational load for allowing control of the magnitude of said first drive current and of said operational load,
    at least one reference stage comprising essentially an image circuit of said first stage with a reference current source for supplying a second drive current for said reference stage, and a reference load, said reference current source and said reference load comprising a plurality of second controllable current source and load components for allowing control of the magnitude of said second drive current and of said reference load and being essentially identical to said first current source and load components, said reference stage also comprising;

an input stage connected for receiving an adjustable reference parameter and for controlling, by means of said reference parameter, current supply from said reference current source and said operational current source to said second and first controllable load components, respectively, a comparison and control circuit connected for comparing the magnitude of said reference load with a load reference and for controlling an operational parameter of said reference load and operational load components so as to keep the relationship between said reference load and said load reference the same irrespective of the magnitude of the current through said reference load, and thereby keeping the operational point of said first stage constant for various drive currents in the latter.

2. A control circuit system according to claim 1, wherein said operational parameter of said reference load and operational load components is the voltage drop of said components.

3. A control circuit system according to claim 1, wherein said reference parameter is a reference current and said input stage including a transistor component connected for throughflow of said reference current, and by said reference and operational current sources each including an essentially identical transistor component, the control electrodes of which is connected to a voltage outlet of said transistor component of said input stage.

4. A control circuit system according to claim 3, wherein said transistor components of said input stage and said reference current source are interconnected in a current image circuit.

5. A control circuit system according to claim 1, wherein said load components of said reference stage and said first stage are transistor components, having control electrodes to which a voltage output from said comparison and control circuit is connected.

6. A control circuit system according to claim 5, wherein said comparison and control circuit includes an operational amplifier having a first input connected for sensing the voltage over said load transistor component of said reference stage and a second input connected for sensing a fixed reference voltage constituting said load reference.

7. A control circuit system according to claim 3, wherein said transistor components of said reference and operational current sources are NMOS-transistors.

8. A control circuit system according to claim 7, wherein said transistor components of said reference and operational loads are PMOS-transistors.

9. A control circuit system according to claim 1, further comprising a plurality of reference stage.

10. A control circuit system according to claim 1, wherein said operational loads and current sources included in said first stage have a different size than said loads and current sources included in said reference stage.

11. A control circuit system according to claim 1, wherein said first stage comprising different combinations and numbers of said operational circuits, said operational current source and said operational load.

12. A control circuit system according to claim 1, wherein said parameters include power, bandwidth, and delay.

* * * * *